US008946617B2

(12) United States Patent
Holz et al.

(10) Patent No.: US 8,946,617 B2
(45) Date of Patent: Feb. 3, 2015

(54) PHOTODIODE HAVING A P-N JUNCTION WITH VARYING EXPANSION OF THE SPACE CHARGE ZONE DUE TO APPLICATION OF A VARIABLE VOLTAGE

(75) Inventors: Juergen Holz, Wenzenbach (DE); Andre Wachowiak, Dresden (DE); Stefan Slesazeck, Fischbach (DE)

(73) Assignee: NaMLab gGmbH, Dresden (DE)

( * ) Notice: Subject to any disclaimer, the term of this patent is extended or adjusted under 35 U.S.C. 154(b) by 224 days.

(21) Appl. No.: 13/293,930

(22) Filed: Nov. 10, 2011

(65) Prior Publication Data

US 2012/0286144 A1  Nov. 15, 2012

(30) Foreign Application Priority Data

Nov. 12, 2010 (DE) .......................... 10 2010 043 822

(51) Int. Cl.
*G01J 3/50* (2006.01)
*G01J 1/42* (2006.01)
*H01L 27/144* (2006.01)
*H01L 31/103* (2006.01)

(52) U.S. Cl.
CPC .............. *H01L 27/1446* (2013.01); *G01J 1/42* (2013.01); *G01J 3/50* (2013.01); *H01L 31/103* (2013.01)
USPC .................................... 250/214.1; 250/214 R

(58) Field of Classification Search
USPC ............... 250/214.1, 239, 214 R; 327/514; 257/290–292, 440, 80–85
See application file for complete search history.

(56) References Cited

U.S. PATENT DOCUMENTS

| 5,965,875 | A | 10/1999 | Merrill |
| 6,111,271 | A * | 8/2000 | Snyman et al. ................. 257/80 |
| 6,803,557 | B1 * | 10/2004 | Taylor et al. ............... 250/214.1 |
| 6,885,047 | B2 * | 4/2005 | Shinohara et al. ........... 257/292 |
| 7,180,150 | B2 * | 2/2007 | Min ............................... 257/440 |
| 7,368,762 | B2 * | 5/2008 | Tennant et al. ............... 257/184 |
| 7,579,642 | B1 * | 8/2009 | Bulucea ........................ 257/303 |
| 2004/0119093 | A1 | 6/2004 | Cohen et al. |
| 2006/0244089 | A1 * | 11/2006 | Sawada et al. ................ 257/462 |
| 2007/0114626 | A1 | 5/2007 | Kang et al. |
| 2010/0148040 | A1 * | 6/2010 | Sanfilippo et al. ......... 250/214.1 |

FOREIGN PATENT DOCUMENTS

| DE | 2 33 244 | 2/1986 |
| DE | 2 92 771 | 8/1991 |
| JP | 59 004 183 | 1/1984 |
| WO | 2008/068616 | 6/2008 |

OTHER PUBLICATIONS

"Integrated Color Pixels in .18-um Complementary Metal Oxide Semiconductor Technology", Peter B. Catrysse, et al., Dec. 2003, Journal of Optical Society of America, vol. 20 (14 pgs.).

* cited by examiner

*Primary Examiner* — Georgia Y Epps
*Assistant Examiner* — Carolynn A Moore
(74) *Attorney, Agent, or Firm* — Dicke, Billig & Czaja, PLLC

(57) ABSTRACT

A photodiode comprises a semiconductor material having a p-n junction, the p-n junction being located between a first doping region of a first doping type and a second doping region of a second doping type, the second doping region comprising a highly doped layer and a lightly doped layer. A photodiode further comprises a voltage source being capable to apply a variable voltage between the first doping region and the lightly doped layer of the second doping region in order to vary the expansion of a space charge zone of the p-n junction.

17 Claims, 8 Drawing Sheets

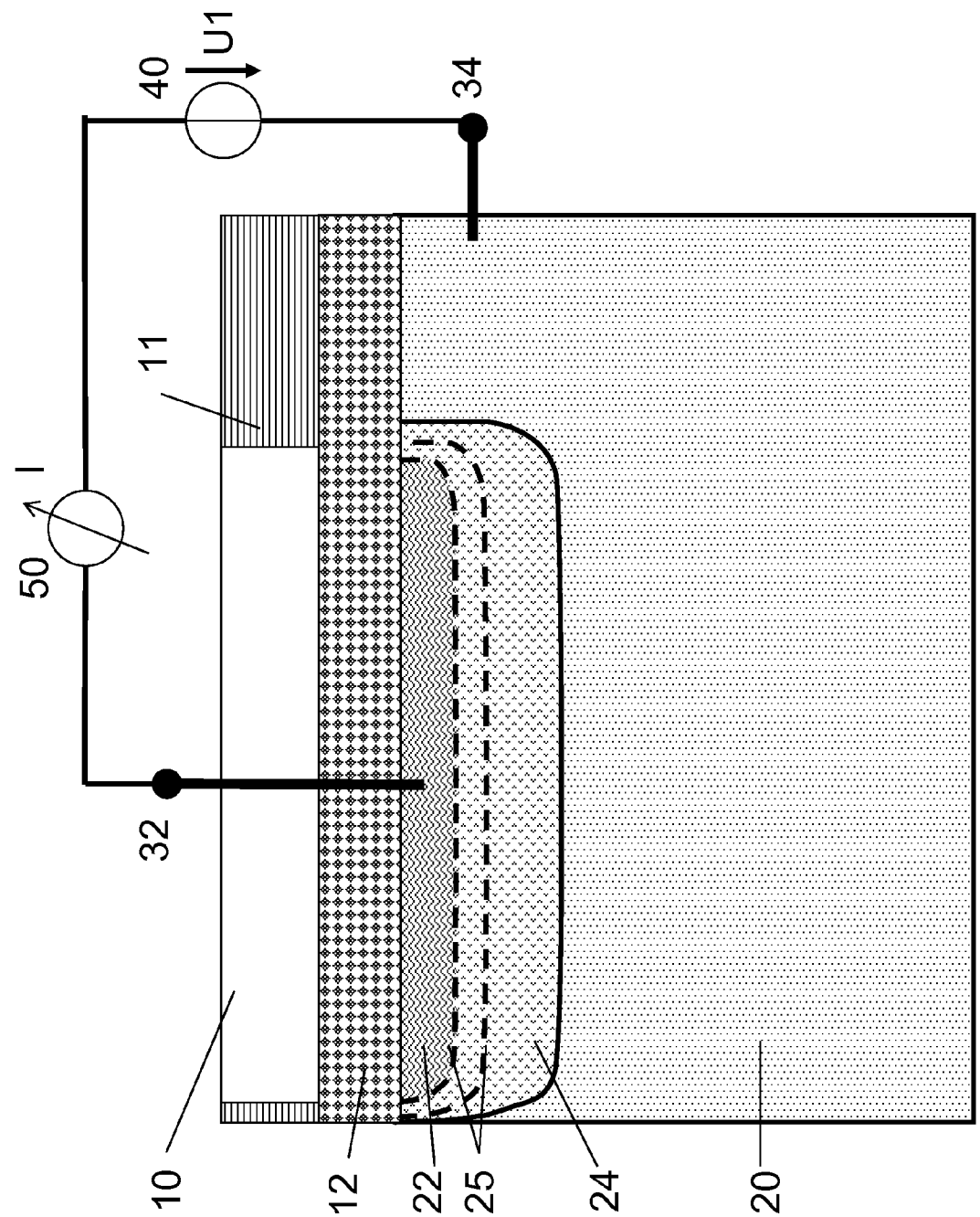

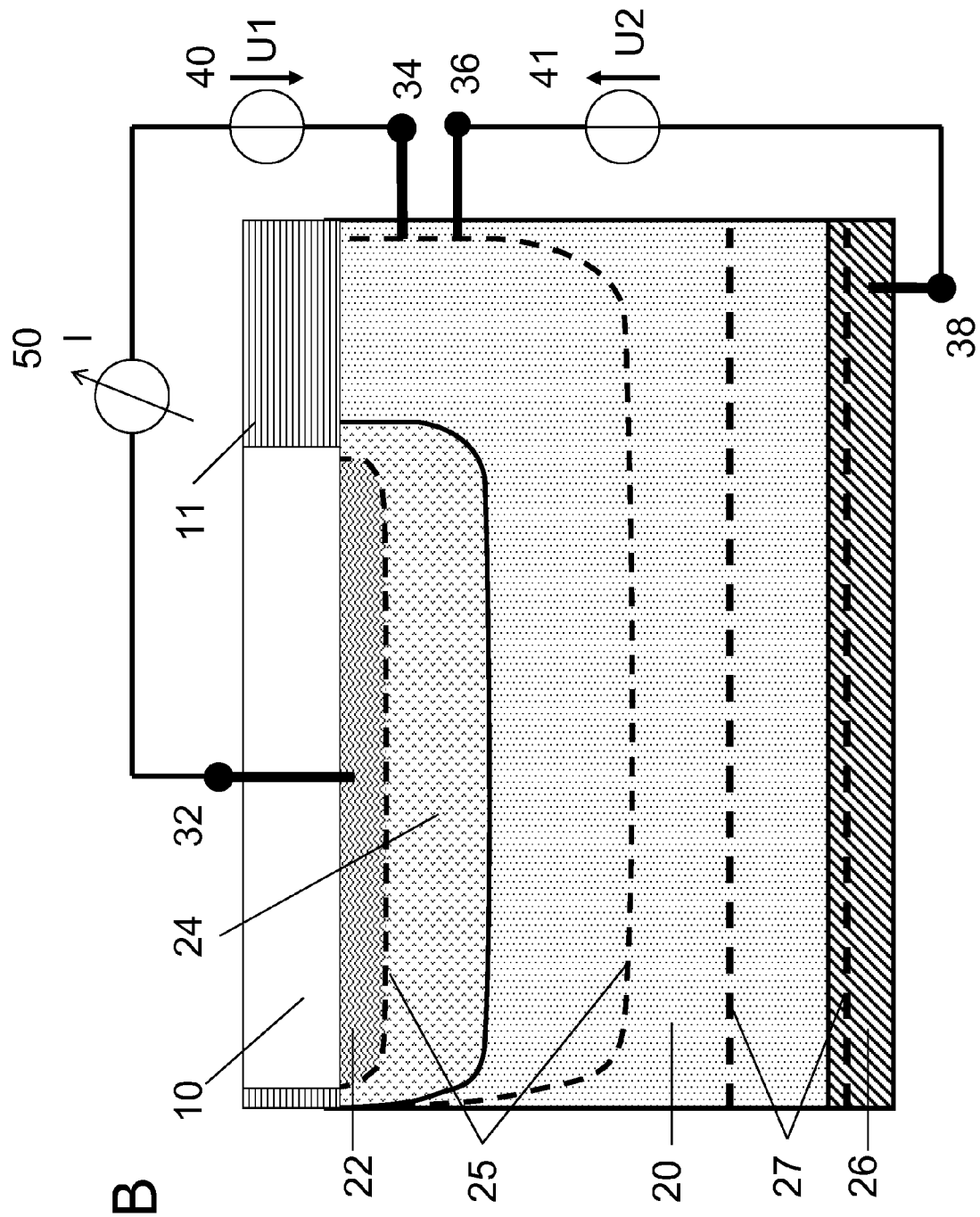

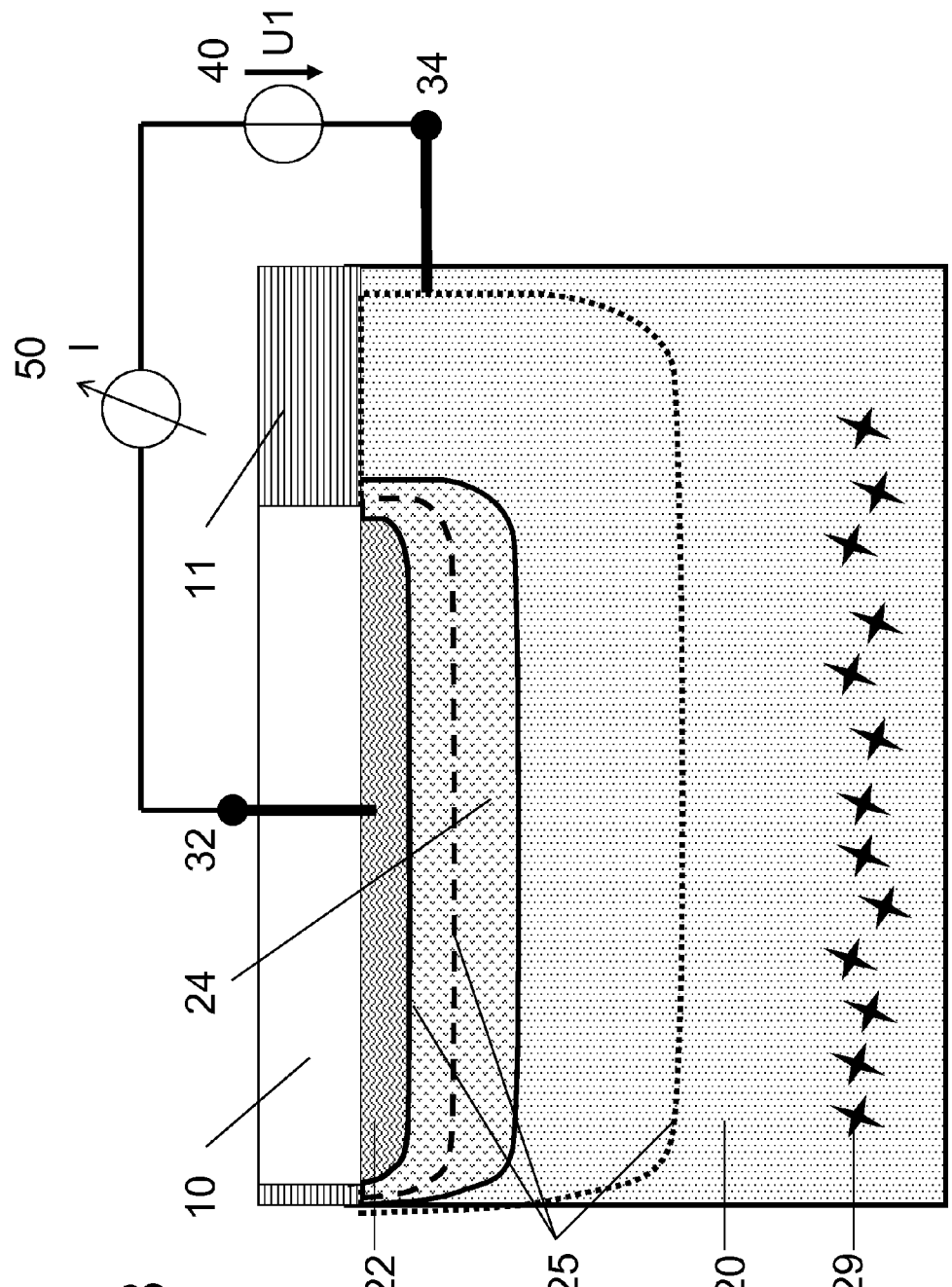

US 8,946,617 B2

PHOTODIODE HAVING A P-N JUNCTION WITH VARYING EXPANSION OF THE SPACE CHARGE ZONE DUE TO APPLICATION OF A VARIABLE VOLTAGE

CROSS-REFERENCE TO RELATED APPLICATIONS

This Utility Patent Application claims priority to German Patent Application No. DE 10 2010 043 822.7 filed on Nov. 12, 2010, which is incorporated herein by reference.

FIELD

The invention relates to an integrated circuit, and in one embodiment includes a photodiode embodied as a semiconductor diode including a p-n junction, in which electromagnetic radiation in the visible and adjacent spectral range is converted into electric current by using the internal photoelectric effect. The invention further relates to a photodiode array in which a plurality of photodiodes are interconnected.

BACKGROUND

Photodiodes operating in the spectral range with a wavelength of up to approximately 1.1 µm are usually produced from silicon. Photodiodes composed of germanium or InGaAs are sensitive in the infrared range. By using further compound semiconductor materials, for example II-VI semiconductors or else organic semiconductor materials, further spectral ranges can furthermore be covered.

The p-n junction in the semiconductor material is produced by using regions having differing doping which provide for a change of charge carrier type. In the region of the p-n junction, a depletion layer, also called space charge zone, depleted of charge carriers is formed on account of diffusion and recombination processes, in which depletion layer an electric field prevails which provides for a separation of the charge carriers in the space charge zone. On account of the continuous thermal generation of charge carriers in the space charge zone and in adjacent regions of the neutral zone from which the charge carriers migrate into the space charge zone as a result of diffusion, a small current, also called reverse current, flows permanently via the space charge zone.

If electromagnetic radiation impinges on the space charge zone or, respectively, the adjacent diffusion region, further electron-hole pairs are generated which, in addition to the permanent reverse current, provide for a photocurrent generated by the electromagnetic radiation. In this case, the photocurrent is proportional to the intensity of the electromagnetic radiation. The electromagnetic radiation has to have a minimum energy in order to generate the charge carriers, the known energy being dependent on the band gap of the semiconductor material used. A limit wavelength above which the sensitivity decreases greatly thus results for each semiconductor material. Furthermore, the penetration depth of the electromagnetic radiation is also greatly dependent on the wavelength, the penetration depth increasing with longer wavelengths. In the case of silicon, for example, electron-hole pairs are generated by using visible light up to a limit wavelength of 1.1 µm, approximately 90% of the incident light radiation being absorbed at a depth of 0.5 µm in the case of blue light, up to depth of 1.1 µm in the case of green light and up to a depth of 8.5 µm in the case of red light.

In order to detect the colour information of electromagnetic radiation over a relatively large wavelength range with the aid of photodiodes, as is carried out for example during the detection of colour images with the aid of photodiode arrays in digital cameras, various solutions are known. Thus, for colour resolution, a plurality of photodiodes each coordinated with the spectral range to be detected are interconnected, wherein the individual photodiodes are provided with spectral filters in order to transmit the desired spectral range to the associated photodiode. In this case, the spectral filter can be embodied as an absorption filter for masking out non-relevant radiation and can be used in a Bayer pattern. Furthermore, transmission gratings are known, which are applied over the photodiodes and act as spectral filters in order that only electromagnetic radiation having a specific wavelength is transmitted. Such a construction is described for example by P. B. Catrysser, B. A. Wandell in: Journal of Optical Society of America, Vol. 20, No. 12, December 2003.

Furthermore, methods are known wherein the electromagnetic radiation is spectrally split with the aid of prisms and fed separately to the assigned photodiodes. Furthermore, there is the possibility, in the case of photodiodes which are sensitive over a wide spectral range, of additionally using discrete filters which are fitted alternately above the photodiode structure in order that the individual spectral ranges are detected sequentially one after another.

Furthermore, in the case of photodiodes, the space charge zone can be expanded by applying a reverse voltage, in order, with the aid of the larger space charge zone, to improve the effectiveness of the charge carrier detection particularly for long-wave electromagnetic radiation having a large penetration depth. However, the range in which the expansion of the space charge zone can be varied under typical operating voltages for photodiodes is predetermined by the doping concentration and is generally not adjustable over the range of approximately 0.1 to 10 µm which is of interest for visible light.

Furthermore, individual photodiodes with spectral resolution are also known wherein no additional spectral filter is required. Thus, U.S. Pat. No. 5,965,875 describes a photodiode construction wherein a plurality of p-n junctions are formed at different depths in the semiconductor material, as a result of which a plurality of space charge zones are formed one above another and separately from one another, which can then be used to simultaneously detect different spectral ranges of the incident light radiation. In this case, each p-n junction has a dedicated electrical connection for reading out the photocurrent detected in the respective spectral range.

WO 2008/068616 furthermore describes a photodiode construction including a large space charge zone, in which, as a result of transverse electric fields being applied, the charge carriers generated at different absorption depths in the space charge zone are separately collected and read out, such that different spectral ranges of the incident light radiation can be resolved. A similar principle is employed in US 2006/0244089, wherein a large-area electrode is applied above a photoactive layer with a large space charge zone, which electrode is insulated from the photoactive layer and can be used to control the extraction region for the charge carriers in a manner dependent on the absorption depth, in order to obtain a spectral resolution of the incident light radiation.

The implementation of spectrally sensitive photodiodes, also referred to as colour sensors hereinafter, as clusters composed of a plurality of photodiodes specifically tailored to the spectrum that is respectively to be detected, or as broadband photodiode with additional colour filters is complex in production and can be integrated only with difficulty into standard processes for producing semiconductor circuits, in particular in CMOS circuits. Furthermore, a large area requirement is generally necessary, which limits the image resolution when such colour sensors are used in CMOS cameras, for example.

Moreover, generally only a discrete colour resolution is possible with the known colour sensors. This also applies, in particular, to photodiodes having multiple p-n junctions in order to provide different absorption depths and hence spectral sensitivities. Furthermore, each p-n junction has to be individually electrically connected in order that the charge carriers generated can be read out separately and the individual colours can thus be resolved.

The design of colour sensors as lateral photodiodes having a multiplicity of electrical connections in order, by using corresponding transverse fields, to read out the charge carriers from different absorption depths and thus to obtain a colour resolution demands a large area requirement and is furthermore complex in production. In the case of the photodiode structure proposed in US 2006/0244089, wherein control is obtained with the aid of an insulated surface electrode, there is the difficulty that the electrode material already absorbs electromagnetic radiation prior to penetration into the actual photoactive layer. As a result, particularly in the short-wave spectral range, less light intensity is available for electrical signal formation.

For these and other reasons there is a need for the present invention.

SUMMARY

One or more embodiments provide a simply constructed photodiode having substantially continuously variably tuneable colour resolution and a small area requirement. Further provided is a photodiode array having a high lateral and spectral resolution.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 1 schematically illustrates in cross section a first embodiment of a photodiode according to the invention, wherein FIG. 1A illustrates the photodiode when no reverse voltage is applied.

FIG. 2 schematically illustrates in cross section a second embodiment of a photodiode according to the invention including a sink for minority charge carriers, wherein FIG. 2B illustrates the photodiode when a high reverse voltage is applied.

FIG. 3 schematically illustrates in cross section a third embodiment of a photodiode according to the invention including a sink for minority charge carriers.

DETAILED DESCRIPTION

Figure 1B:
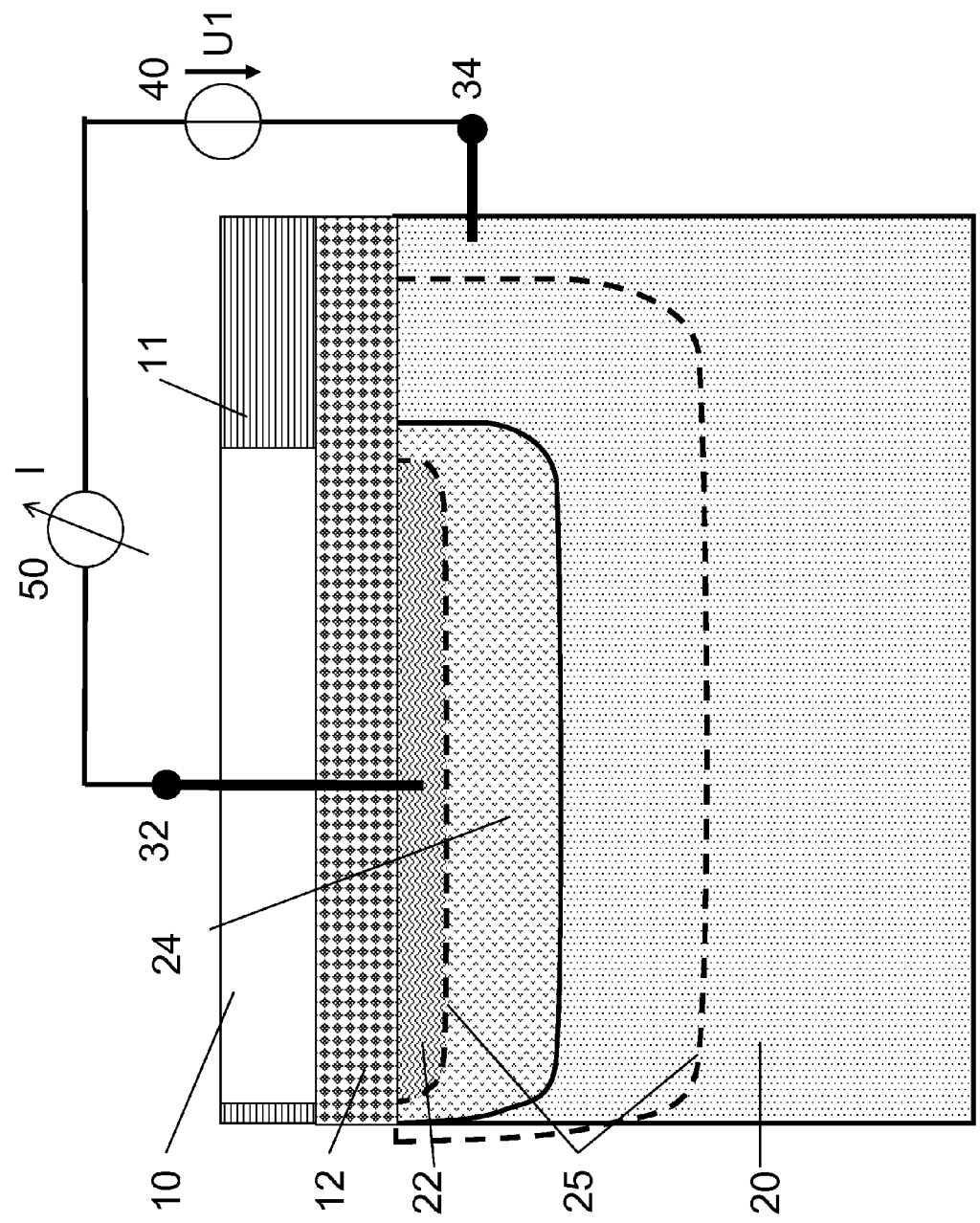
FIG. 1B illustrates the photodiode when a high reverse voltage is applied.

In the following, reference is made to embodiments of the invention. However, it should be understood that the invention is not limited to specific described embodiments. Instead, any combination of the following features and elements, whether related to different embodiments or not, is contemplated to implement and practice the invention. Furthermore, in various embodiments the invention provides numerous advantages over the prior art. However, although embodiments of the invention may achieve advantages over other possible solutions and/or over the prior art, whether or not a particular advantage is achieved by a given embodiment is not limiting of the invention. Thus, the following embodiments, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

One or more embodiments provide a simply constructed photodiode having substantially continuously variably tuneable colour resolution and a small area requirement. Further provided is a photodiode array having a high lateral and spectral resolution.

According to an embodiment of the invention, a photodiode includes a semiconductor material having a p-n junction. The p-n junction is located between a first doping region of a first doping type and a second doping region of a second doping type, the second doping region including a highly doped layer and a lightly doped layer. The photodiode further includes a voltage source being capable to apply a variable voltage between the first doping region and the lightly doped layer of the second doping region in order to vary the expansion of a space charge zone of the p-n junction.

According to a further embodiment of the invention, a photodiode array includes a plurality of photodiodes, each photodiode including a semiconductor material having a p-n junction. The p-n junction is located between a first doping region of a first doping type and a second doping region of a second doping type, wherein laterally arranged isolation trenches are provided between the individual photodiodes.

According to a further embodiment of the invention, a photodiode including a semiconductor material having a p-n junction, the p-n junction being located between a first doping region of a first doping type and a second doping region of a second doping type, the second doping region including a highly doped layer and a lightly doped layer, is operated by applying a voltage between the first doping region and the lightly doped layer of the second doping region, wherein the voltage applied between the first doping region and the lightly doped layer of the second doping region is changed in steps in order to vary the expansion of a space charge zone of the p-n junction, and, in each voltage step, gathering charge carriers generated by an electromagnetic radiation in the space charge zone of the p-n junction between the first doping region and the second doping region.

Also, signal names used below are exemplary names, indicative of signals used to perform various functions in a given memory device. In some cases, the relative signals may vary from device to device. Furthermore, the circuits and devices described below and depicted in the figures are merely exemplary of embodiments of the invention. As recognized by those of ordinary skill in the art, embodiments of the invention may be utilized with any photodiode.

Photodiodes are semiconductor diodes which convert electromagnetic radiation in the visible spectral range into an electric current at a p-n junction by using the internal photoelectric effect. From the electric current, also referred to as photocurrent hereinafter, it is then possible to obtain information about the electromagnetic radiation incident on the photodiode. In this case, one area of use of photodiodes is the use as a colour sensor for example in the detection of colour images, in order to obtain a brightness value and colour information for a specific pixel. In order to be able to carry out a spatial resolution during image detection, the photodiodes are arranged on a camera chip in groups, also referred to hereinafter as photodiode arrays, one- or two-dimensionally.

Photodiodes can be produced from a wide variety of semiconductor materials, both inorganic and organic. The choice of the respective semiconductor material depends on the area of use or the wavelengths of the electromagnetic radiation to be detected. Photodiodes which operate in the visible wavelength range are produced from silicon.

The spectral sensitivity of the photodiode is furthermore determined by the position of the p-n junction and the resulting position of the space charge zone in the photodiode. The penetration depth of the electromagnetic radiation is greatly dependent on the wavelength, the penetration depth decreasing with shorter wavelengths. In the case of silicon, approximately 90% of the incident light radiation is absorbed up to a depth of 0.5 µm in the case of blue light, up to a depth of 1.1 µm in the case of green light, and up to a depth of 8.5 µm in the case of red light.

In order to achieve a photodiode having a continuously variably tuneable colour resolution, in the photodiode according to one or more embodiments, the p-n junction between a first doping region in the semiconductor material, which has a first doping type, for example an n-type doping, and a second doping region of a second doping type, which then has a p-type doping, is constructed such that the second doping region includes, adjacent to the first doping region, a highly doped layer and a lightly doped layer adjacent thereto.

Between the first doping region and the lightly doped layer of the second doping region, with the aid of a voltage source, a variable voltage, also referred to as reverse voltage hereinafter, can be applied in order to vary the expansion of the space charge zone which is formed between the first and second doping regions. By applying the reverse voltage to the photodiode, wherein the positive pole is connected to the n-doped region and the negative pole is connected to the p-doped region, the electric field in the space charge zone is amplified, as a result of which the expansion of the space charge zone increases.

The high doping of the first layer of the second doping region adjacent to the first doping region provides for the formation of only a very narrow space charge zone region in the region of the junction between the first doping region and the second doping region without a voltage being applied, since the expansion of the space charge zone is dependent on the doping density and does not expand as much into highly doped layers. The application of a higher voltage in the reverse direction then has the effect that the space charge zone is enlarged right into the lightly doped layer of the second doping region. In this case, the width of the space charge zone is established continuously variably depending on the magnitude of the applied reverse voltage.

On account of the thermal generation of charge carriers in the space charge zone and in the regions adjacent thereto, from which the charge carriers generated then migrate into the space charge zone by diffusion, a permanent reverse current, also called dark current, arises in the photodiode. Electromagnetic radiation that impinges on the photodiode then generates in the region of the space charge zone, inter alia, further electron-hole pairs which are extracted by using the electric field prevailing in the region of the space charge zone and lead to an additional reverse current, also called photocurrent.

Since the penetration depth of the electromagnetic radiation is dependent on the wavelength, with an increasing depth, i.e. a larger space charge zone, longer-wave radiation increasingly contributes to the generation of charge carriers. With the aid of a control circuit connected to the variable voltage source of the photodiode, the voltage applied by the voltage source between the first doping region and the lightly doped layer of the second doping region is changed in steps, wherein, in each step, the charge carriers generated in the space charge zone in the junction between the first doping region and the second doping region are detected with the aid of a current detection circuit.

In this case, the detected charge carrier currents increase with increasing voltage, wherein the current increase is dependent on the wavelength since, in the expanding space charge zone region, long-wave radiation increasingly contributes to the generation of charge carriers. From the detected photocurrents, a wavelength-dependent intensity spectrum of the incident electromagnetic radiation can thus be determined by suitable transformation. This procedure makes possible a continuously variably tuneable colour resolution with an individual photodiode up to the limit wavelength of the semiconductor material used.

FIGS. 1A and 1B schematically illustrate in cross section a possible construction of a photodiode which is tuneable continuously variably with regard to the colour resolution. The colour sensor is described on the basis of a silicon photodiode which is sensitive in the visible spectral range. Instead of silicon, however, it is also possible to use an alternative semiconductor material having the desired spectral sensitivity.

The photodiode, as illustrated in FIGS. 1A and 1B, has an optical window 10 as seen in the direction of light incidence. The optical window 10 is designed so as to ensure a maximum transparency for the entire wavelength range in which the photodiode is sensitive, as a result of which the radiation can penetrate through the optical window 10 substantially in an unimpeded manner. Furthermore, the optical window 10 can be used for the passivation of defects at the interface with the adjacent semiconductor layer which would otherwise reduce the charge carrier yield. Furthermore, the area of incidence on the photodiode can be defined with the optical window 10.

In order to prevent the generation of charge carriers as a result of light incidence laterally outside the photodiode, a radiation-opaque layer or a layer stack 11 can be arranged alongside the optical window 10. This light-opaque layer stack 11 can contain reflective metal layers or a highly absorbent layer, e.g., polyimide. The optical window 10 can be a filling composed of a dielectric such as, for example, silicon oxide or silicon nitride. The optical window 10 can also be a region etched free in the radiation-opaque layer 11, wherein a thin dielectric layer 12 can be applied for the protection and passivation of the photodiode. However, the passivation layer 12 can also be a transparent trench isolation such as is used usually for the isolation of individual components in CMOS technologies. The photodiode is then situated below the layer of the trench isolation, which typically has a depth of 0.3-2.0

μm and is likewise filled with silicon oxide or silicon nitride. The photodiode can thus be easily integrated into a CMOS production process. The isolation layer 12 can also replace the optical window itself.

The actual photodiode adjacent to the isolation layer 12 has a lightly doped region 20. The construction of the photodiode is described for one doping polarity in the following explanations. Instead of the doping polarity indicated, it is also possible to choose the inverted version, which results from replacing p- and n-type doping.

The lightly doped region 20 is, for example, a material of a silicon substrate or of an epitaxially grown layer, the material being weakly p-doped with boron, with a doping of $1\times10^{13}$ to $1\times10^{15}$ $1/cm^3$. In the lightly p-doped region 20, a first highly n-doped layer 22 is formed adjacent to the optical window 10 and the isolation layer 12. The n-type doping, which can be implemented by implantation or indiffusion of phosphorus, for example, is in this case $1\times10^{17}$ to $1\times10^{19}$ $1/cm^3$. Adjacent to the highly n-doped layer 22, a highly p-doped layer 24 is in turn implemented, which is obtained for example by implantation or indiffusion of boron and has a doping of $1\times10^{15}$ to $5\times10^{17}$ $1/cm^3$. In this case, the total thickness of the highly n-doped layer 22 and of the highly p-doped layer 24 is 0.3 to 3 μm.

The lightly p-doped region 20 in which the doping layers 22, 24 are implemented has a thickness of 8 to 20 μm.

The highly n-doped layer 22 and the lightly p-doped region 20 are connected to a voltage source 40 via contacts 32, 34. The voltage source 40 supplies a variable voltage. Furthermore, a current detection circuit 50 is connected via the contacts 32, 34 in order to detect a current flow between the p-doped region 20 and the n-doped layer 22.

FIG. 1A illustrates the silicon photodiode in an operating state in which no voltage is applied via the voltage source 40. In the photodiode, a space charge zone 25 free of charge carriers is formed between the highly n-doped layer 22 and the adjacent highly p-doped layer 24 on account of the concentration gradient between the electrons as charge carriers in the highly n-doped layer 22 and the holes as charge carriers in the highly p-doped layer 24 and the resultant charge carrier diffusion, the space charge zone being formed in a narrowly delimited manner around the p-n junction on account of the high doping of the two layers. The expansion of the space charge zone 25 is illustrated in a dashed fashion in FIG. 1A and lies in the region of the absorption length of blue light on account of the chosen dimensioning of the highly n-doped layer 22 and of the adjacent highly p-doped layer 24. The blue light penetrating right into the depth of the space charge zone 25 generates electron-hole pairs which are separated by the electric field of the space charge zone 25 and engender a photocurrent, which is determined with the aid of the current detection circuit 50 via the contacts 32, 34.

FIG. 1B illustrates the photodiode when a reverse voltage is applied via the voltage source 40. The applied electrical voltage amplifies the electric field of the p-n junction, such that the expansion of the space charge zone 25 is increased. In this case, the voltage can be set such that, as illustrated in a dashed fashion in FIG. 1B, the space charge zone 25 extends across the highly p-doped layer 24 far into the adjacent lightly p-doped region 20.

On account of the space charge zone 25 of the p-n junction which is enlarged as a result of the application of the reverse voltage, the photocurrent of the junction now also predominantly includes charge carriers which are generated by longer waves of the red spectral range of the incident light at a larger absorption depth. The photocurrent is in turn detected using the current detection circuit 50 via the contacts 32, 34. By varying the reverse voltage applied using the voltage source 40, there is the possibility of setting the spectral sensitivity of the space charge zone 25. In order to detect the colour spectrum of the light impinging on the photodiode, the reverse voltage applied using the voltage source 40 is increased in steps and the corresponding photocurrent is detected using the current detection circuit 50 in each step. An evaluation electronic unit (not shown) then evaluates the detected photocurrents and determines the wavelength-dependent intensity spectrum of the incident light using a transformation process.

Figure 2A:
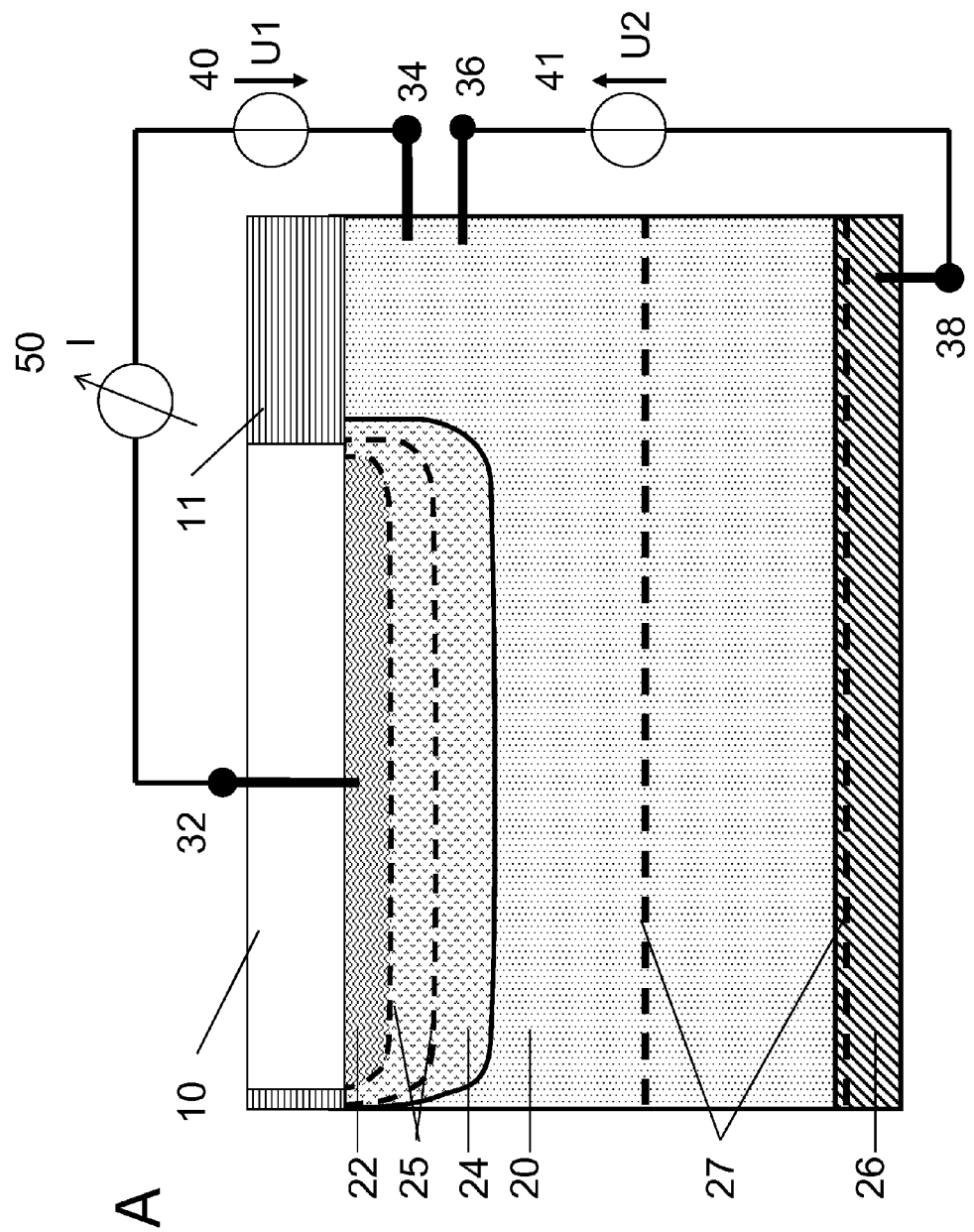
FIG. 2A illustrates the photodiode when no reverse voltage is applied.

FIGS. 2A and 2B schematically illustrate in cross section a further embodiment of a photodiode which is tuneable continuously variably with regard to the colour resolution and in which a sink for minority charge carriers is additionally provided. The colour sensor is again described on the basis of a silicon photodiode that is sensitive in the visible spectral range. Instead of silicon, however, an alternative semiconductor material having the desired spectral sensitivity can be used in this case, too.

The photodiode illustrated in FIGS. 2A and 2B is in this case constructed analogously to the photodiode shown in FIGS. 1A and 1B, where no isolation layer is implemented below the optical window 10. Such a further isolation layer can likewise be provided here.

On the rear side of the lightly p-doped region 20, in the case of the photodiode illustrated in FIGS. 2A and 2B, a highly n-doped region 26 having a doping of more than $1\times10^{15}$ $1/cm^3$ is additionally implemented. The highly n-doped region 26 can be produced for example by the epitaxial growth of the lightly p-doped region 20 on a highly n-doped silicon substrate, which then serves as the region 26. In one embodiment, a lightly p-doped silicon substrate can serve as the lightly p-doped region 20. The highly n-doped region 26 can be formed by rear-side grinding of the lightly p-doped silicon substrate and by subsequent rear-side indiffusion or implantation of n-type dopants. The highly n-doped layer 26 and the lightly p-doped region 20, which form a further p-n junction, are connected to a further voltage source 41 via contacts 36, 38. The further voltage source 41 supplies a variable voltage.

FIG. 2A illustrates the silicon photodiode in an operating state in which no voltage is applied using the voltage source 40, but a reverse voltage is applied using the further voltage source 41. The space charge zone 25 (dashed line) at the first p-n junction between the highly n-doped front side layer 22 and the adjacent highly p-doped layer 24 is formed in a narrowly delimited manner around the p-n junction, on account of the relatively high doping of the two layers and the absence of reverse voltage. In this case, the space charge zone 25 lies in the region of the absorption length of blue light on account of the chosen dimensioning of the highly n-doped front side layer 22 and the adjacent highly p-doped layer 24. The blue light penetrating right into the depth of the space charge zone 25 generates electron-hole pairs which are separated by the electric field of the space charge zone 25 and form a photocurrent, which is read out with the aid of the current detection circuit 50 via the contacts 32, 34.

Besides the first space charge zone 25 in the region of the two highly n-and p-doped layers 22, 24 at the front side of the photodiode, a second space charge zone 27 (dashed line) is also formed at the rear side between the weakly p-doped region 20 and the highly n-doped rear side layer 26, the second space charge zone extending far into the region 20 on account of the low doping in the region 20 and the reverse voltage applied using the further voltage source 41. The second space charge zone 27 at the second p-n junction serves as a sink for minority charge carriers in order to trap charge carriers generated by the longer-wave light advancing right into this region. This is because charge carriers generated in this region could migrate by diffusion into the first space charge zone 25 near the surface and thus contribute to the photocurrent detected by the current detection circuit 50. This possible disturbance current is extracted towards the rear through the second space charge zone 27, the electric field of which is oriented oppositely to the first space charge zone, for which reason the second space charge zone 27 acts as a sink for the minority charge carriers. The sink for minority charge carriers thus limits the disturbance current generated by charge carrier diffusion and improves the colour resolution.

FIG. 2B illustrates the photodiode when a reverse voltage is applied using the voltage source 40, no voltage being applied using the further voltage source 41. The applied electrical voltage of the first voltage source 40 amplifies the electric field of the first p-n junction, such that the expansion of the space charge zone 25 (dashed line) increases. In this case, the voltage can be set such that, as shown in FIG. 2B, the space charge zone 25 extends across the highly p-doped layer 24 far into the adjacent lightly p-doped region 20. Since no voltage is applied to the second p-n junction using the second voltage source 41, the expansion of the space charge zone 27 of the second p-n junction, which serves as a sink for minority charge carriers, is shortened, as shown in dashed fashion in FIG. 2B.

On account of the space charge zone 25 of the first p-n junction, that is enlarged as a result of the application of the reverse voltage using the voltage source 40, the photocurrent of the first p-n junction also includes charge carriers of the red spectral range of the incident light, which generates electron-hole pairs at a larger absorption depth. The photocurrent is once again detected using the current detection circuit 50 via the contacts 32, 34.

By varying the voltages applied using the voltage sources 40, 41, there is the possibility of setting the spectral sensitivity of the first space charge zone 25. In order to detect the colour spectrum of the light impinging on the photodiode, the first voltage source 40 increases the reverse voltage applied to the first p-n junction in processes, while the second voltage source 41 decreases the reverse voltage applied to the second p-n junction in steps. In each step, the current detection circuit 50 detects the corresponding photocurrent. The evaluation electronic unit (not shown) then evaluates the detected photocurrents and determines the wavelength-dependent intensity spectrum of the incident light using a transformation process.

FIG. 3 schematically illustrates in cross section a further embodiment of the photodiode according to the invention, wherein a region 29 having suitable recombination centres, for example defects, is used as a sink for minority charge carriers as an alternative to the second p-n junction shown in FIG. 2A and FIG. 2B. In the case of the embodiment shown in FIG. 3, the recombination centre layer 29 is formed laterally below the p-n junction. However, the recombination centre layer 29 can also be arranged with any desired extent and position for example vertically with respect to the upper p-n junction, in order to trap the minority charge carriers generated in this region and to prevent the minority charge carriers from diffusing into the space charge zone and thus contributing to the photocurrent. In order to form the recombination centre layer 29, impurity atoms, for example oxygen, can be introduced into the lightly p-doped region 20 or the silicon substrate and crystal defects, for example dislocations, can also be produced.

In the embodiment illustrated in FIG. 3, since the recombination centre layer 29 replaces the second p-n junction as a sink for minority charge carriers, only the first voltage source 40 is necessary for generating the reverse voltage between the contacts 32 and 34, which varies the expansion of the first space charge zone 25. The expansion of the first space charge zone 25 is depicted in dashed fashion for the operating case of no reverse voltage and in dotted fashion for the case of applied reverse voltage in FIG. 3. Combinations of an additional p-n junction, such as is shown in FIGS. 2A and 2B, and a region 29 having suitable recombination centres, such as is shown in FIG. 3, can also be used as a sink for minority charge carriers.

Figure 4:
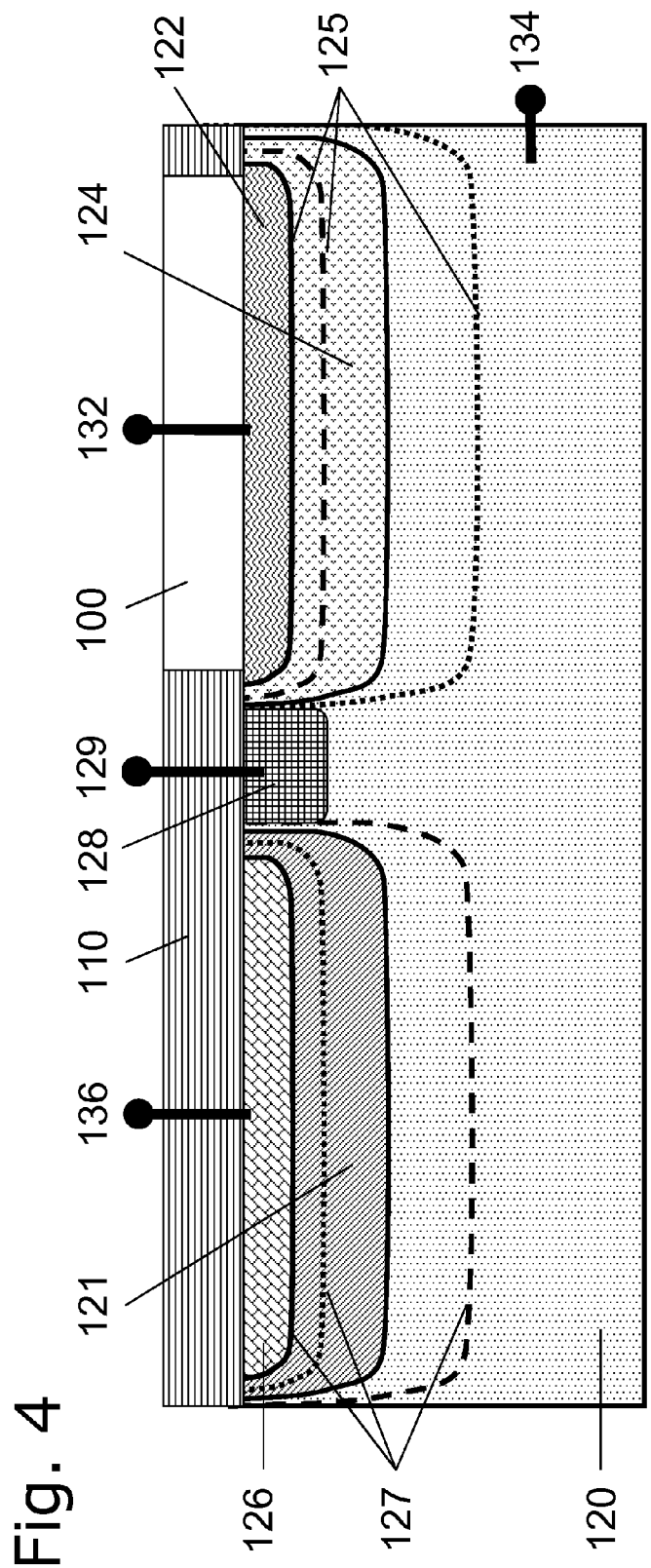
FIG. 4 schematically illustrates in cross section a fourth embodiment of a photodiode according to the invention including a sink for minority charge carriers.

FIG. 4 schematically illustrates in cross section a further embodiment of the photodiode according to the invention, wherein all contacts and doping layers are embodied on the front side. The basic structure of the photodiode corresponds to the photodiode illustrated in FIG. 1 and FIG. 2, including a first p-n junction for detecting the photocurrent, which is arranged below an optical window 100 for the light incidence. The first p-n junction is formed in the lightly p-doped substrate 120 by using a first highly p-doped region 124, in which a shallow highly n-doped region 122 is embodied. The highly n-doped region 122 and a lightly p-doped substrate 120 are respectively connected via contacts 132, 134 serving for applying the electrical voltage and also for detecting the photocurrent (voltage source, current detection circuit and evaluation circuit are not shown).

As a sink for minority charge carriers, a second p-n junction is arranged laterally alongside the first p-n junction for detecting the photocurrent, the second p-n junction being formed identically to the first p-n junction, wherein the first p-n junction and the second p-n junction can be produced jointly. The second p-n junction has, in the lightly p-doped substrate 120, a highly p-doped region 121, in which once again a shallow highly n-doped region 126 is arranged. A highly p-doped region 128 can additionally be arranged between the first p-n junction for detecting the photocurrent and the second p-n junction for trapping the minority charge carriers, the highly p-doped region leading to improved separation of the space charge zones. This region 128 can likewise be provided with a contact connection 129 for applying a potential.

In order to reduce the disturbance current, a light-opaque region 110 is furthermore arranged outside the optical window 100, the light-opaque region providing for absorption or reflection of the impinging light radiation and thus preventing the incident radiation from generating electron-hole pairs outside the first p-n junction. However, it is also possible to fit a further optical window above the second p-n junction, such that in this case the second p-n junction does not operate as a sink, but also as a further active photodiode.

The operation (without a further optical window above the second p-n junction) of the photodiode in accordance with the embodiment illustrated in FIG. 4 is explained below. In this case, the space charge zone 125 of the first p-n junction for generating the photocurrent and the space charge zone 127 of the second p-n junction for trapping the minority charge carriers are set independently of one another by the application of a voltage relative to the substrate 120, for which reason the highly n-doped region 126 has a dedicated contact 136. FIG. 4 illustrates, in dashed fashion, the size of the space charge zones 125, 127 for the first p-n junction and the second p-n junction if no voltage is applied to the first p-n junction for detecting the photocurrent, but a reverse voltage is present at the second p-n junction for trapping the minority charge carriers. The space charge zone 125 of the first p-n junction is then formed in shallow fashion in order principally to detect charge carriers from short-wave light. The space charge zone 127 of the second p-n junction extends far into the lightly p-doped region 120 in order to trap charge carriers generated outside the first space charge zone.

FIG. 4 illustrates in the form of dotted lines the expansion of the space charge zones 125, 127 if a reverse voltage is applied to the first p-n junction for forming a deep space charge zone 125, in order that charge carriers from long-wave light can also be detected. By contrast, no reverse voltage is applied to the second p-n junction, in order to keep the space charge zone 127 small and to prevent photocurrent being extracted from the first space charge zone 125.

Figure 5:
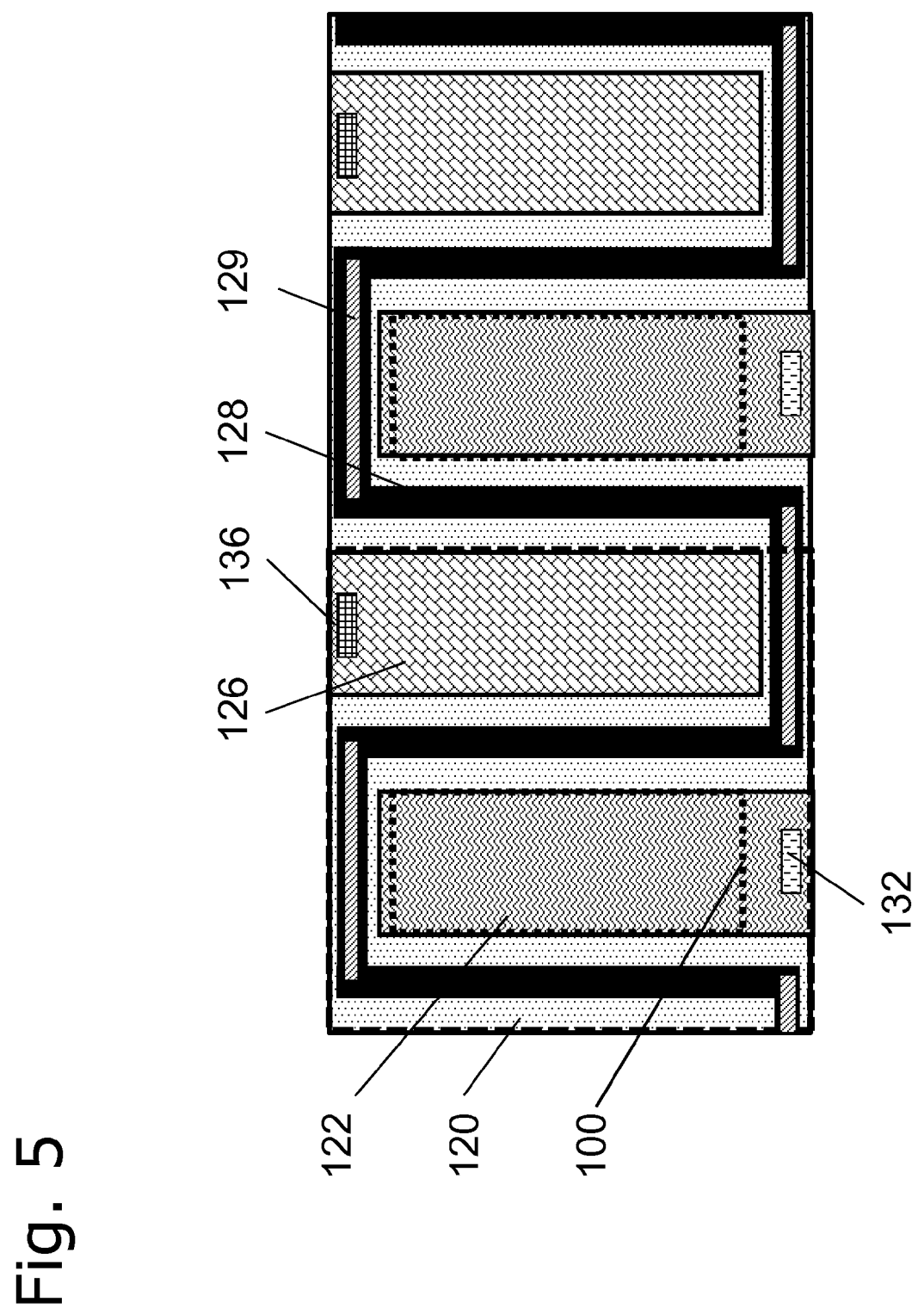
FIG. 5 schematically illustrates a plan view of an excerpt from a photodiode array including photodiodes in accordance with the embodiment illustrated in FIG. 4.

FIG. 5 illustrates in plan view an excerpt from a photodiode array including two photodiodes in accordance with the construction illustrated in FIG. 4, wherein the extent of the unit cell including two adjacent photodiodes is indicated by a dashed boundary. The photodiode construction is distinguished by a simple construction and a small area requirement.

Figure 6:
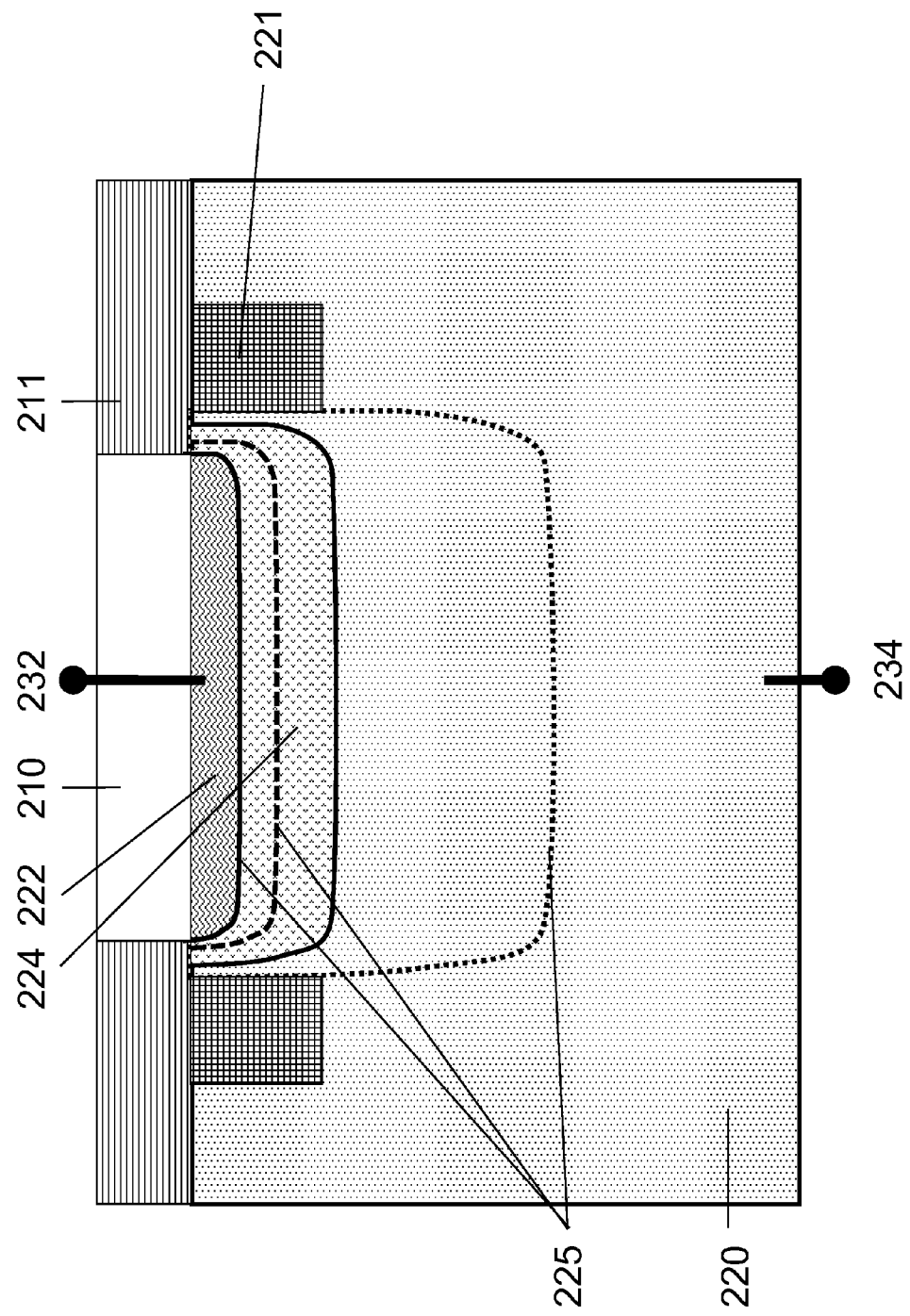
FIG. 6 schematically illustrates in cross section a fifth embodiment of the photodiode according to the invention including vertical isolation trenches.

FIG. 6 schematically illustrates in cross section a further embodiment of a photodiode according to the invention, which is suitable in one embodiment for use in a photodiode array. In this case, the photodiode includes a p-n junction having a shallow, highly n-doped region 222 near the surface, this region being implemented in a highly p-doped region 224 below an optical window 210. Both regions 222, 224 are in turn arranged in a weakly p-doped region 220.

No additional sink for minority charge carriers is provided in the embodiment illustrated in FIG. 6. However, there is the possibility, as illustrated in FIG. 2, of using a p-n junction directed oppositely to the p-n junction for the photocurrent as a sink or else of providing, as illustrated in FIG. 3, a recombination centre layer, or else both.

The two highly n- and p-doped regions 222, 224 of the photodiode are delimited by vertical isolation trenches 221. In this case, the depth of the isolation trenches 221 corresponds at least to the thickness of the n- and p-doped regions 222, 224. With the aim of optimizing the area of the individual cell in the photodiode array, the isolation trenches 221 are made as narrow as possible. In the case of silicon photodiodes, silicon oxide or silicon nitride is used as isolation material.

A directed expansion of the space charge zone 225 of the photodiode is achieved with the aid of the isolation trenches 221. The expansion of the space charge zone 225 is depicted in dashed fashion for the operating case of no reverse voltage and in dotted fashion for the case of applied reverse voltage in FIG. 6. At the same time, the isolation trenches prevent charge carriers from laterally adjacent regions from indiffusing into the space charge zone. Thus, particularly when the photodiodes are arranged one- or two-dimensionally in the context of a photodiode array, an improved lateral resolution is achieved. In a photodiode array, the photodiodes are in this case completely delimited with respect to one another by the isolation trenches 221, whereby the photoactive region of the individual photodiode cell is precisely defined.

The photodiodes illustrated in the figures have been explained on the basis of the example of a photocurrent-generating p-n junction in a weakly p-doped semiconductor region with a highly n-doped region and an adjacent highly p-doped region. As already explained, there is also the possibility of choosing the dopings in reversed fashion and implementing the photodiode in a weakly n-doped semiconductor region with a highly p-doped layer and a highly n-doped layer adjacent thereto. Moreover, instead of a normal semiconductor substrate, an SOI (Silicon-On-Insulator) substrate can be used. Furthermore, when silicon is used as basic material, the photodiodes can be embodied in the context of known CMOS process technology, wherein the individual highly doped regions can be implemented by implantation and/or diffusion processes. The doped semiconductor regions can be contact-connected to metal connections using known methods. The photodiodes can then be formed in common process steps together with the voltage source, the current detection circuit and the evaluation circuit, as a result of which cost-effective production is made possible.

To sum up, a photodiode includes a p-n junction between a first doping region of a first doping type and a second doping region of a second doping type, wherein the second doping region includes, adjacent to the first doping region, a highly doped layer and a lightly doped layer adjacent thereto. Furthermore, provision is made of a voltage source for applying a variable voltage between the first doping region and the lightly doped layer of the second doping region in order to vary the expansion of the space charge zone by way of the p-n junction.

The doping regions in the semiconductor material and the possibility of applying a variable voltage via the doping regions, the photodiode has an adjustable spectral sensitivity. The design of one doping region with a firstly high and then low doping has the effect that, without an applied voltage, the space charge zone remains narrow in the region of the p-n junction, such that, from an electromagnetic radiation impinging on the photodiode, the charge carriers generated in this narrow space charge zone are detected. The photo current thus predominantly results from a short-wave and narrowly delimited spectral range of the electromagnetic radiation impinging on the photodiode. By applying a voltage to the photodiode, it is then possible for the space charge zone to be expanded beyond the highly doped layer into the adjacent lightly doped layer, such that the charge carriers generated by the electromagnetic radiation are detected over a larger spectral range, also including charge carriers generated by longer wavelengths at a larger absorption depth. The expansion of the space charge zone and hence the spectral range of the electromagnetic radiation impinging on the photodiode, the spectral range being detected with the aid of the photo current, can be set continuously variably by way of the strength of the applied voltage. By varying the voltage and sequentially detecting the photo current, it is thus possible to achieve a full colour resolution of the electromagnetic radiation impinging on the photodiode.

The photodiode is furthermore distinguished by simple production, wherein, in comparison with a standard photodiode, an additional doping step for producing the highly doped layer in the second doping region is necessary. This process can easily be included in the conventional process schemes for producing integrated circuits. The colour photo sensor which is continuously variably tuneable according to the invention furthermore requires only a small area and is therefore suitable for use in high-resolution digital cameras.

The photodiode may be produced from silicon, wherein the first doping region of the p-n junction has a doping of $1\times10^{17}$ to $1\times10^{19}$ $1/cm^3$. The highly doped layer of the second doping region of the p-n junction has a doping of $1\times10^{15}$ to $5\times10^{17}$ $1/cm^3$, and the lightly doped layer has a doping of $1\times10^{13}$ to $1\times10^{15}$ $1/cm^3$. The p-n junction composed of the first doping region and second doping region has a thickness of 8 to 10 µm, wherein the first doping region and the highly doped layer of the second doping region together have a thickness of 0.3 to 3 µm. With a photodiode constructed in this way, it is possible to detect a full colour spectrum for visible light up to the limit wavelength of silicon at approximately 1.1 µm. By varying the applied voltage and sequentially reading out the photocurrent respectively generated, a continuously variably tuneable colour resolution is obtained. The silicon photodiode can furthermore be integrated in a simple manner into the standard CMOS process in order to connect the photodiode for example to a current detection circuit on an individual chip.

The photodiode may further include, adjacent to the lightly doped layer of the second doping region of the p-n junction, a sink for minority charge carriers. By providing such an additional sink, it is possible to significantly improve the resolution of the colour sensor, since charge carriers generated outside the desired space charge zone are prevented from diffusing into the space charge zone and then contributing to the photocurrent.

In this case, the sink for minority charge carriers can be arranged below the p-n junction in the semiconductor material, as seen in the direction of incidence of radiation, as a result of which it is possible to achieve a compact construction with a small area requirement which is suitable in one embodiment for use in high-resolution CMOS cameras. The sink for minority charge carriers in the semiconductor material can also be arranged alongside the p-n junction. In order to produce the sink for minority charge carriers, it is also possible to provide an arrangement of suitable recombination centres in the semiconductor material, for example by introducing impurity atoms or dislocations. In this case, the recombination centres can be arranged at any desired location and with any desired extent, such that an optimum sink profile is achieved. However, the sink for minority charge carriers can also be embodied as a third doping region of the first doping type, which forms a further p-n junction with the lightly doped layer of the second doping region. As a result, there is the possibility of optimally adapting the sink to the respective wavelength range of the incident light radiation to be detected by applying a voltage that varies the size of the space charge zone of the further p-n junction.

The voltage may be applied by the voltage source between the first doping region and the lightly doped layer of the second doping region is changed in processes. In each step, the charge carriers generated by an impinging electromagnetic radiation in the space charge zone in the junction between the first doping region and the second doping region are detected with the aid of a current detection circuit in order then to determine a wavelength-dependent intensity spectrum of the electromagnetic radiation from the photocurrents detected in processes using linear combination. With a photosensor constructed in this way, there is the possibility of tuning the spectral colour sensitivity virtually continuously variably in a simple manner, in order to obtain an intensity spectrum of the electromagnetic radiation.

When photodiodes are used in a photodiode array, such as is used in one embodiment in a high-resolution CMOS camera, an isolation trench is provided between the individual photodiodes. The isolation trench provides for a directed electrical expansion of the space charge zone. There is thus the possibility of providing photodiode arrays having a small cell size and at the same time high spectral resolution.

What is claimed is:

1. A photodiode comprising:
a semiconductor material having a p-n junction, the p-n junction being located between a first doping region of a first doping type and a second doping region of a second doping type, the second doping region comprising a highly doped layer and a lightly doped layer, the highly doped layer being arranged adjacent to the first doping region and the lightly doped layer being arranged adjacent to the highly doped layer;
a voltage source, the voltage source being connected to the first doping region and the lightly doped layer of the second doping region via contacts, the voltage source configured to apply a variable voltage between the first doping region and the lightly doped layer of the second doping region in order to vary the expansion of a space charge zone of the p-n junction from a region of the junction between the first doping region and the highly doped layer of the second doping region to a region enlarged from the first doping region via the highly doped layer of the second doping region into the lightly doped layer of the second doping region; and
a current detection circuit, the current detection circuit being connected to the first doping region and the lightly doped layer of the second doping region via the contacts in order to detect a current flow between the first doping region and the second doping region.

2. The photodiode according to claim 1, wherein the semiconductor material is silicon.

3. The photodiode according to claim 2, wherein the first doping region has a doping of $1 \times 10^{17}$ to $1 \times 10^{19}$ $1/cm^3$, the highly doped layer of the second doping region has a doping of $1 \times 10^{15}$ to $5 \times 10^{17}$ $1/cm^3$ and the lightly doped layer of the second doping region has a doping of $1 \times 10^{13}$ to $1 \times 10^{15}$ $1/cm^3$, wherein the first doping region and the second doping region in the semiconductor material have a thickness of 8 to 20 μm and wherein the first doping region and the highly doped layer of the second doping region have a thickness of 0.3 to 3 μm.

4. The photodiode according to claim 1, wherein a sink for minority charge carriers is provided, which is arranged adjacent to the lightly doped layer of the second doping region in the semiconductor material.

5. The photodiode according to claim 4, wherein the sink for minority charge carriers is arranged below the p-n junction in the semiconductor material.

6. The photodiode according to claim 4, wherein the sink for minority charge carriers in the semiconductor material is arranged laterally alongside the p-n junction.

7. The photodiode according to claim 4, wherein the sink for minority charge carriers comprises a third doping region of the first doping type in the semiconductor material, which forms a further p-n junction with the lightly doped layer of the second doping region.

8. The photodiode according to claim 4, wherein the sink for minority charge carriers is an arrangement of recombination centres in the semiconductor material.

9. The photodiode according to claim 1, wherein the voltage source is capable to change the voltage applied by the voltage source between the first doping region and the lightly doped layer of the second doping region in steps, wherein, in each step, the charge carriers generated by an electromagnetic radiation in the space charge zone of the p-n junction between the first doping region and the second doping region are detected by a current detection circuit in order to determine a wavelength-dependent intensity spectrum of the electromagnetic radiation from the charge carrier currents detected in steps using transformation.

10. The photodiode according to claim 1, wherein an isolation trench in each case laterally delimits the first doping region and the second doping region in the semiconductor material.

11. The photodiode according to claim 1, being part of a photodiode array.

12. A photodiode array comprising:
a plurality of photodiodes, each photodiode comprising
a semiconductor material having a p-n junction, the p-n junction being located between a first doping region of a first doping type and a second doping region of a second doping type, the second doping region comprising a highly doped layer and a lightly doped layer, the highly doped layer being arranged adjacent to the first doping region and the lightly doped layer being arranged adjacent to the highly doped layer, a voltage source, the voltage source being connected to the first doping region and the lightly doped layer of the second doping region via contacts, the voltage source configured to apply a variable voltage between the first doping region and the lightly doped layer of the second doping region in order to vary the expansion of a space charge zone of the p-n junction from a region of the junction between the first doping region and the highly doped layer of the second doping region to a region enlarged from the first doping region via the highly doped layer of the second doping region into the lightly doped layer of the second doping region, and a current detection circuit, the current detection circuit being connected to the first doping region and the lightly doped layer of the second doping region via the contacts in order to detect a current flow between the first doping region and the second doping region, wherein laterally arranged isolation trenches are provided between the individual photodiodes.

13. The photodiode array according to claim 12, wherein the plurality of photodiodes are silicon photodiodes, and wherein isolation trenches are made of any of silicon oxide and silicon nitride.

14. A method of operating a photodiode comprising a semiconductor material having a p-n junction, the p-n junction being located between a first doping region of a first doping type and a second doping region of a second doping type, the second doping region comprising a highly doped layer and a lightly doped layer, the highly doped layer being arranged adjacent to the first doping region and the lightly doped layer being arranged adjacent to the highly doped layer, a voltage source, the voltage source being connected to the first doping region and the lightly doped layer of the second doping region via contacts, the voltage source configured to apply a variable voltage between the first doping region and the lightly doped layer of the second doping region in order to vary the expansion of a space charge zone of the p-n junction from a region of the junction between the first doping region and the highly doped layer of the second doping region to a region enlarged from the first doping region via the highly doped layer of the second doping region into the lightly doped layer of the second doping region, and a current detection circuit, the current detection circuit being connected to the first doping region and the lightly doped layer of the second doping region via the contacts in order to detect a current flow between the first doping region and the second doping region, the method comprising:

applying a voltage by the voltage source between the first doping region and the lightly doped layer of the second doping region, wherein the voltage applied between the first doping region and the lightly doped layer of the second doping region is changed in steps in order to vary the expansion of a space charge zone of the p-n junction; and, in each voltage step, gathering charge carriers generated by an electromagnetic radiation in the space charge zone of the p-n junction between the first doping region and the second doping region by the current detection circuit.

15. The method according to claim 14, comprising:

determining a wavelength-dependent intensity spectrum of the electromagnetic radiation from the charge carrier currents gathered in the voltage steps using transformation.

16. The method according to claim 15, wherein the photodiode is operated as a part of a photodiode array, wherein an isolation trench laterally delimits the first doping region and the second doping region in the semiconductor material.

17. A device including a photodiode comprising:

a semiconductor material having a p-n junction, the p-n junction being located between a first doping region of a first doping type and a second doping region of a second doping type, the second doping region comprising a highly doped layer and a lightly doped layer, the highly doped layer being arranged adjacent to the first doping region and the lightly doped layer being arranged adjacent to the highly doped layer;

a voltage source, the voltage source being connected to the first doping region and the lightly doped layer of the second doping region via contacts, the voltage source configured to apply a variable voltage between the first doping region and the lightly doped layer of the second doping region in order to vary the expansion of a space charge zone of the p-n junction from a region of the junction between the first doping region and the highly doped layer of the second doping region to a region enlarged from the first doping region via the highly doped layer of the second doping region into the lightly doped layer of the second doping region; and a current detection circuit electrically coupled to the semiconductor material.

* * * * *